United States Patent
Lim et al.

(10) Patent No.: US 9,722,572 B2
(45) Date of Patent: Aug. 1, 2017

(54) QUARTZ VIBRATOR AND MANUFACTURING METHOD OF THE SAME

(71) Applicant: Samsung Electro-Mechanics Co., Ltd., Suwon-si (KR)

(72) Inventors: Seung Mo Lim, Suwon-si (KR); Ho Phil Jung, Suwon-si (KR); Won Han, Suwon-si (KR); Dong Joon Oh, Suwon-si (KR); Sung Wook Kim, Suwon-si (KR); Tae Joon Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 339 days.

(21) Appl. No.: 14/508,770

(22) Filed: Oct. 7, 2014

(65) Prior Publication Data

US 2015/0303896 A1    Oct. 22, 2015

(30) Foreign Application Priority Data

Apr. 21, 2014  (KR) .......................... 10-2014-0047654

(51) Int. Cl.
*H01L 41/18* (2006.01)
*H03H 9/19* (2006.01)
*H03H 9/13* (2006.01)

(52) U.S. Cl.
CPC ............... *H03H 9/19* (2013.01); *H03H 9/13* (2013.01)

(58) Field of Classification Search
CPC ............. H03H 9/19; H03H 9/13; H01L 41/18
USPC .................................. 310/360, 361, 365–368
See application file for complete search history.

(56) References Cited

U.S. PATENT DOCUMENTS

| 4,306,170 | A | * | 12/1981 | Motte | ..................... G04F 5/063 310/361 |
| 4,454,443 | A | * | 6/1984 | Lukaszek | ........... H03H 9/02023 310/348 |
| 4,926,086 | A | * | 5/1990 | Bourgeois | .......... H03H 9/02023 310/361 |
| 8,581,476 | B2 | | 11/2013 | Amano et al. | |
| 2013/0241358 | A1 | * | 9/2013 | Mizusawa | ............ H03H 9/1021 310/348 |

* cited by examiner

*Primary Examiner* — Thomas Dougherty
(74) *Attorney, Agent, or Firm* — NSIP Law

(57) ABSTRACT

Embodiments of the invention provide a quartz vibrator, including a long side in a Y' axis direction, a side in the Y' axis direction including a first crystal face and a second crystal face formed thereon, and another side including an AT-cut quartz piece including a first crystal face and a second crystal face formed thereon and electrode layers formed on the AT-cut quartz piece.

15 Claims, 11 Drawing Sheets

QUARTZ VIBRATOR AND MANUFACTURING METHOD OF THE SAME

CROSS REFERENCE TO RELATED APPLICATION

This application claims the benefit of and priority under 35 U.S.C. §119 to Korean Patent Application No. KR 10-2014-0047654, entitled "QUARTZ VIBRATOR AND MANUFACTURING METHOD OF THE SAME," filed on Apr. 21, 2014, which is hereby incorporated by reference in its entirety into this application.

BACKGROUND

Field of the Invention

The present invention relates to a quartz vibrator and a manufacturing method of the same.

Description of the Related Art

In general, since a vibrating piece using quartz may obtain a high frequency and have stable frequency characteristic, it has been used for a reference frequency source or an oscillating source of various electronic devices. To this end, a quartz gemstone is machined into a quartz piece in a direction suitable for characteristic and the quartz piece is used as a vibrator, as a non-limiting example.

Particularly, a quartz substrate cut with an AT-cut is cut so that a face formed by rotating a plane including an X axis and a Z axis of a quartz crystal at an angle of about 35 degree and 15 minute in a counterclockwise from the X axis around the X axis becomes a main face, and since the vibrating piece using the quartz substrate has excellent frequency and temperature characteristics, it has been widely used for a mobile communications terminal, as a non-limiting example.

However, since the AT-cut quartz substrate according to the conventional art as disclosed, for example, in U.S. Pat. No. 8,581,476, uses a wet etching method in order to machine a side, an order of faces revealed becomes different depending on a kind of etchant and a temperature of the etchant, and the etched face is not perpendicular to a flat main face and has an obliquely inclined shape and is revealed in various faces. As a result, the AT-cut quartz substrate may not be implemented as a precise element.

SUMMARY

Accordingly, embodiments of the invention have been made to provide a quartz vibrator capable of increasing an effect of an energy trap, allowing a low equivalent serial resistance (ESR), and having a stable natural frequency as a irregular multi-face is not formed on a side by machining the side using position deviation of a mask upon machining the side of a AT-cut quartz vibrating piece having a long side of a Y' axis to thereby enable a correct chip design and form a stable structure, and a manufacturing method of the same.

According to at least one embodiment, a quartz vibrator includes a long side in a Y' axis direction, includes one side in the Y' axis direction having a first crystal face and a second crystal face formed thereon, and includes another side including an AT-cut quartz piece having a first crystal face and a second crystal face formed thereon and electrode layers formed on the AT-cut quartz piece.

According to at least one embodiment, the first crystal face and the second crystal face formed on one side of the AT-cut quartz piece and the first crystal face formed on the other side thereof are formed of an inclined face.

According to at least one embodiment, the second crystal face formed on the other side of the AT-cut quartz piece is formed in a direction perpendicular to the Y' axis direction.

According to at least one embodiment, the AT-cut quartz piece has a short side of an X axis and a thickness in a Z' axis direction.

According to at least one embodiment, the AT-cut quartz piece has one side in the X axis direction having the first crystal face and the second crystal face formed thereon and the other side having the first crystal face and the second crystal face formed thereon.

According to at least one embodiment, the first crystal face and the second crystal face formed on one side of the AT-cut quartz piece and the first crystal face and the second crystal face formed on the other side thereof are formed of an inclined face.

According to at least one embodiment, the AT-cut quartz piece has protrusion parts formed on both surfaces in a Z' axis direction, and the electrode layers are each formed on the protrusion parts.

According to at least one embodiment, the AT-cut quartz piece is vibrated in an X axis direction.

According to another embodiment of the invention, a manufacturing method of a quartz vibrator includes the steps of preparing an AT-cut quartz piece having a long side of a Y' axis; disposing a first mask and a second mask on both surfaces of the AT-cut quartz piece in a Z' axis direction to be spaced apart from each other in the Y' axis direction, forming a first crystal face and a second crystal face by etching one side of the AT-cut quartz piece and forming a groove part by etching the other side of the AT-cut quartz piece, and separating the AT-cut quartz piece as a single chip by cutting the groove part.

According to at least one embodiment, the manufacturing method further includes forming a third mask for forming bevels on both surfaces of the AT-cut quartz piece in the Z' axis direction after etching one side and the other side of the AT-cut quartz piece by the first mask and the second mask, forming protrusion parts for forming the bevels by etching the AT-cut quartz piece, and forming electrode layers on the protrusion parts.

According to at least one embodiment, one side of the AT-cut quartz piece is etched by the first mask and the second mask, and in a state in which the protrusion parts remain on one side, the protrusion parts are removed by an etching for forming the protrusion part by the third mask.

According to another embodiment of the invention, a quartz vibrator includes a long side in a Y' axis direction, includes one side in the Y' axis direction having a first crystal face formed thereon, and includes the other side including an AT-cut quartz piece having a first crystal face and a second crystal face formed thereon and electrode layers formed on the AT-cut quartz piece.

According to at least one embodiment, the first crystal face formed on the other side of the AT-cut quartz piece is formed of an inclined face.

According to at least one embodiment, the second crystal face formed on the other side of the AT-cut quartz piece is formed in a direction perpendicular to the Y' axis direction.

According to at least one embodiment, the AT-cut quartz piece has a short side of an X axis and a thickness in a Z' axis direction.

According to at least one embodiment, the AT-cut quartz piece has one side in the X axis direction having the first crystal face and the second crystal face formed thereon and the other side having the first crystal face and the second crystal face formed thereon.

According to at least one embodiment, the first crystal face and the second crystal face formed on one side of the AT-cut quartz piece and the first crystal face and the second crystal face formed on the other side thereof are formed of an inclined face.

According to at least one embodiment, the AT-cut quartz piece has protrusion parts formed on both surfaces in a Z' axis direction, and the electrode layers are each formed on the protrusion parts.

Various objects, advantages and features of the invention will become apparent from the following description of embodiments with reference to the accompanying drawings.

BRIEF DESCRIPTION OF DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Figure 1:
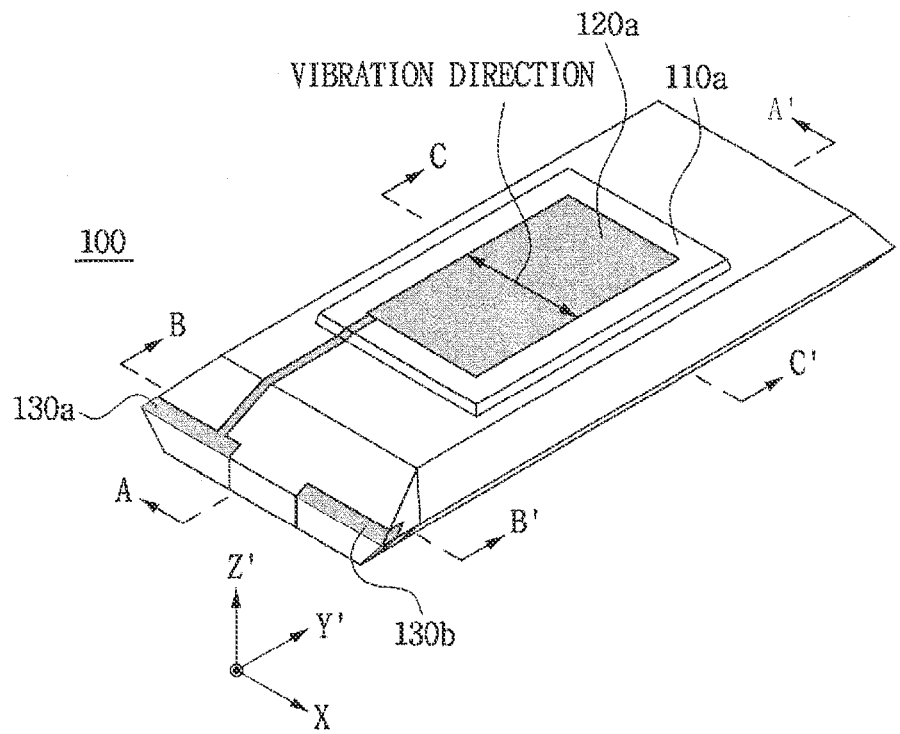
FIG. 1 is a perspective view schematically showing a quartz vibrator according to a first embodiment of the invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention.

Additionally, elements in the drawing figures are not necessarily drawn to scale. For example, the dimensions of some of the elements in the figures may be exaggerated relative to other elements to help improve understanding of embodiments of the present invention. Like reference numerals refer to like elements throughout the specification.

Hereinafter, various embodiments of the present invention will be described in detail with reference to the accompanying drawings.

Figure 2:
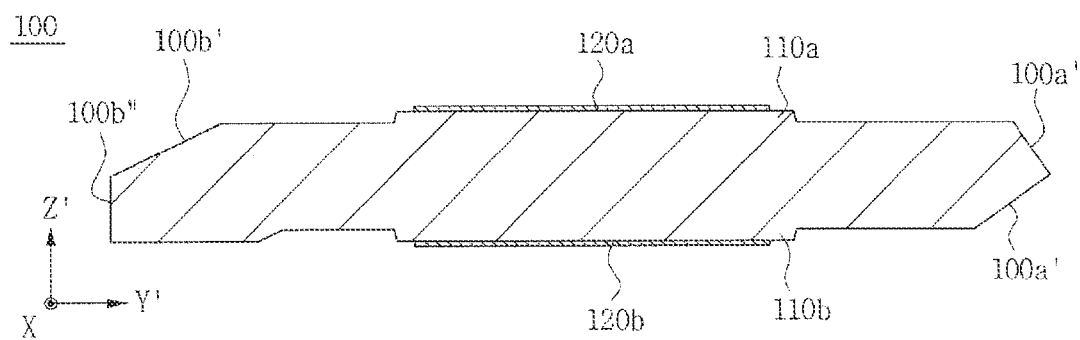
FIG. 2 is a schematic cross-sectional view of the quartz vibrator taken along the line A-A' of FIG. 1 according to the first embodiment of the invention.

FIG. 1 is a perspective view schematically showing a quartz vibrator according to a first embodiment of the invention, and FIG. 2 is a schematic cross-sectional view of the quartz vibrator taken along the line A-A' of FIG. 1 according to the first embodiment of the invention.

As shown, the quartz vibrator 100, which uses a quartz piece cut with an AT-cut, has a long side in a Y' axis direction, a short side in an X axis direction, and a thickness in a Z' axis direction. According to at least one embodiment, the quartz vibrator 100 has a face formed by the Y' axis and the X axis and the thickness in the Z' axis direction extended in a direction perpendicular to the face, and is vibrated in the X axis direction.

According to at least one embodiment, an electrode layer is formed on the AT-cut quartz piece to form a quartz vibrator.

More specifically, a first crystal face 100a' and a second crystal face 100a" are formed on one side of the quartz vibrator 100 in the Y' axis direction, and a first crystal face 100b' and a second crystal face 100b" are formed on the other side thereof.

According to at least one embodiment, the first crystal face 100b' and the second crystal face 100b' axis direction are formed by an etching and a cutting, and one side of the quartz vibrator 100 is formed by the etching.

According to at least one embodiment, in the quartz vibrator 100, the second crystal face 100b' and the second crystal face 100a' of the other side are formed of the face formed by the etching.

According to at least one embodiment, the first crystal face 100a' and the second crystal face 100a' on one side in the Y' axis direction are formed of an inclined face.

According to at least one embodiment, the second crystal face 100b" on one side is formed in a direction perpendicular to a face formed by the X axis and the Y' axis.

According to at least one embodiment, the quartz vibrator 100 has protrusion parts 110a and 110b each formed on an upper cross section and a lower cross section formed by the X axis and the Y' axis in the Z' axis direction, and electrode layers 120a and 120b are each formed on the protrusion parts 110a and 110b to thereby form a bevel.

Figure 3:
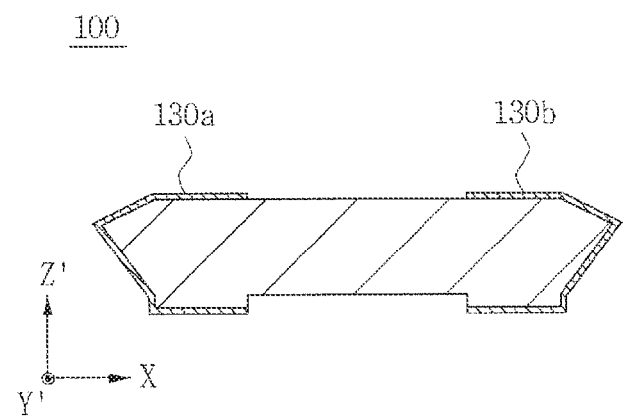
FIG. 3 is a schematic cross-sectional view of the quartz vibrator taken along the line B-B' of FIG. 1 according to the first embodiment of the invention.

According to at least one embodiment, as shown in FIGS. 1, 2, and 3, the quartz vibrator 100 has electrodes 130a and 130b formed at both sides in the X axis direction, at the other side end portion in the Y' axis direction. In addition, at least one of the electrodes 130a and 130b is electrically connected to at least one of the electrode layers 120a and 120b formed on the protrusion parts 110a and 110b.

According to at least one embodiment, the electrodes 130a and 130b are connection electrodes for a connection with the outside and the electrode layers 120a and 120b forming the bevel is formed as vibrating electrodes.

Figure 4:
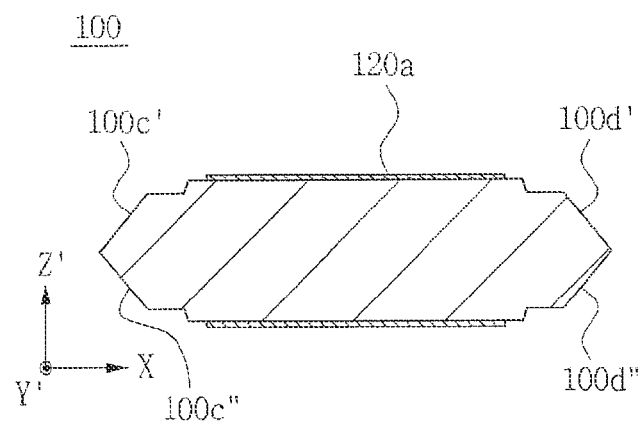
FIG. 4 is a schematic cross-sectional view of the quartz vibrator taken along the line C-C' of FIG. 1 according to the first embodiment of the invention.

Next, as shown in FIG. 4, a first crystal face 100c' and a second crystal face 100c' and a second crystal face 100d According to at least one embodiment, the first crystal faces 100c' and 100d' and the second crystal faces 100c.

According to at least one embodiment, as shown in FIG. 4, the quartz vibrator 100 has generally a cross-section of a hexagon.

By the configuration as described above, the quartz vibrator 100 according to the first embodiment of the invention is vibrated in the X axis direction perpendicular to the long side in the Y' axis direction and does not have an irregular multi-face formed on sides in the Y' axis direction and the X axis direction, such that it implements a correct chip design, improves frequency characteristics, increases an effect of an energy trap due to a stable structure, implements a low equivalent serial resistance (ESR), and has a stable natural frequency.

Figure 5:
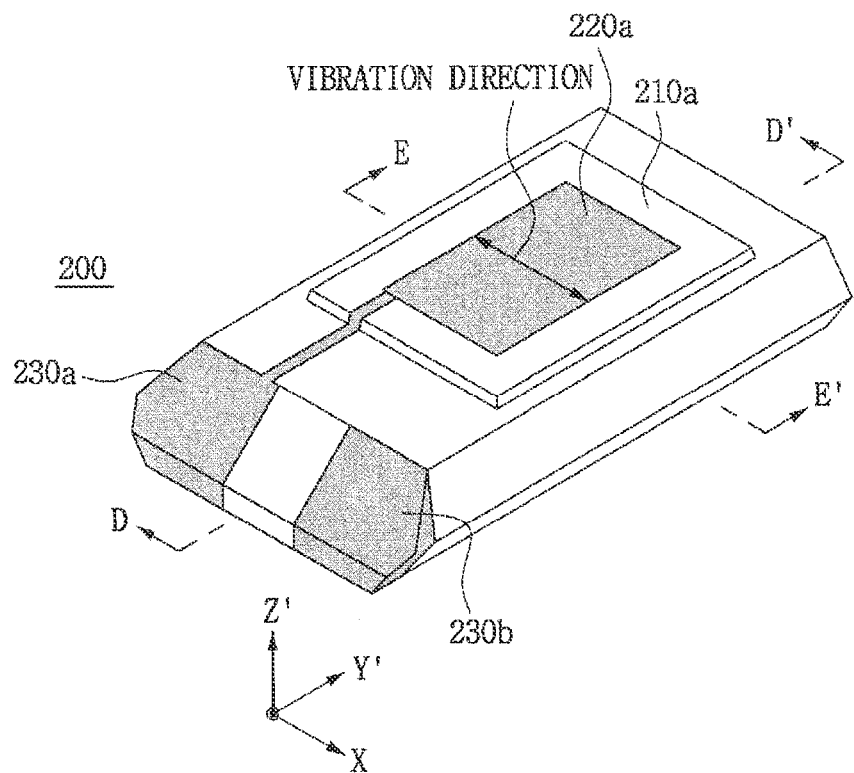
FIG. 5 is a perspective view schematically showing a quartz vibrator according to a second embodiment of the invention.
Figure 6:
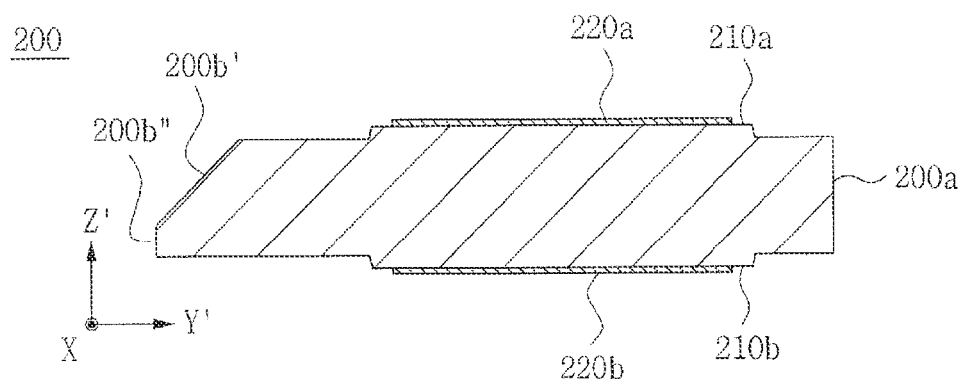
FIG. 6 is a schematic cross-sectional view of the quartz vibrator taken along the line D-D' of FIG. 5 according to the second embodiment of the invention.
Figure 7:
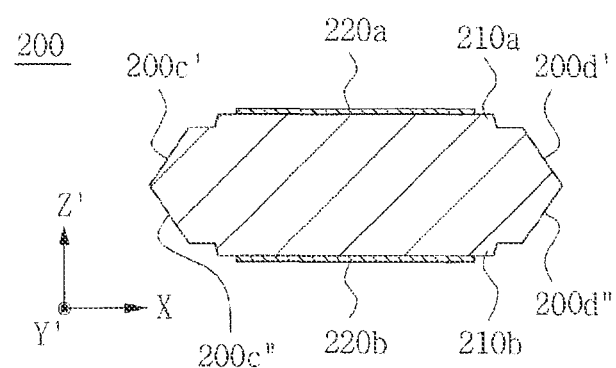
FIG. 7 is a schematic cross-sectional view of the quartz vibrator taken along the line E-E' of FIG. 5 according to the second embodiment of the invention.

FIG. 5 is a perspective view schematically showing a quartz vibrator according to a second embodiment of the invention, FIG. 6 is a schematic cross-sectional view of the quartz vibrator taken along the line D-D' of FIG. 5 according to the second embodiment of the invention, and FIG. 7 is a schematic cross-sectional view of the quartz vibrator taken along the line E-E' of FIG. 5 according to the second embodiment of the invention.

As shown, the quartz vibrator 200 uses a plate-shaped quartz vibrating piece cut with the AT-cut. The quartz vibrator 200 according to the second embodiment of the invention is different only in a shape of a side in the Y' axis direction as compared to the quartz vibrator 100 according to the first embodiment of the invention.

More specifically, the quartz vibrator 200 has a long side in the Y' axis direction, a short side in the X axis direction, and a thickness in the Z' axis direction. That is, the quartz vibrator 200 has a face formed by the Y' axis and the X axis and the thickness in the Z' axis direction extended in a direction perpendicular to the face, and is vibrated in the X axis direction.

According to at least one embodiment, a first crystal face 200a' and a second crystal face 200a' axis direction, and only a first crystal face 200b is formed on the other side thereof.

According to at least one embodiment, the first crystal face 200b on the other side is formed in a direction perpendicular to a face formed by the Y' axis and the X axis.

According to at least one embodiment, the first crystal face 200a' on the other side in the Y' axis direction is formed of an inclined face.

According to at least one embodiment, one side of the quartz vibrator 200 is formed by an etching and the other side of the quartz vibrator 200 is formed by the etching and a cutting.

According to at least one embodiment, in the quartz vibrator 200, the second crystal face 200b' on the other side is formed of the face formed by the etching.

Next, as shown in FIG. 7, a first crystal face 200c' and a second crystal face 200c' and a second crystal face 200d.

According to at least one embodiment, the first crystal faces 200c' and 200d' and the second crystal faces 200c In addition, as shown in FIG. 7, the quartz vibrator 200 has generally a cross-section of a hexagon.

According to at least one embodiment, the quartz vibrator 200 has protrusion parts 210a and 210b each formed on an upper cross section and a lower cross section formed by the X axis and the Y' axis in the Z' axis direction, and electrode layers 220a and 220b are each formed on the protrusion parts 210a and 210b to thereby form a bevel.

According to at least one embodiment, as shown in FIG. 5, the quartz vibrator 200 has electrodes 230a and 230b formed at both sides in the X axis direction, at the other side end portion in the Y' axis direction. In addition, at least one of the electrodes 230a and 230b is electrically connected to at least one of the electrode layers 220a and 220b formed on the protrusion parts 210a and 210b.

By the configuration as described above, the quartz vibrator 200 according to the second embodiment of the invention is vibrated in the X axis direction perpendicular to the long side in the Y' axis direction and does not have an irregular multi-face formed on sides in the Y' axis direction and the X axis direction, such that it implements a correct chip design, improves frequency characteristics, increases an effect of an energy trap due to a stable structure, implements a low equivalent serial resistance (ESR), and has a stable natural frequency.

Hereinafter, a manufacturing process of a quartz vibrator 100 according to the first and second embodiments of the present disclosure will be described in more detail with reference to FIGS. 8 and 9.

FIGS. 8A to 8F are process views schematically showing a manufacturing method of a quartz vibrator according to the first embodiment of the invention.

Figure 8A:
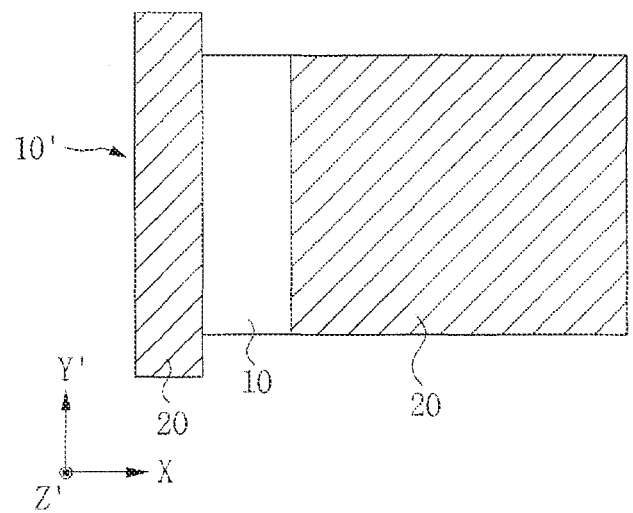
FIGS. 8A to 8F are process views schematically showing a manufacturing method of a quartz vibrator according to the first embodiment of the invention.

As shown in FIG. 8A, an AT-cut quartz piece 10 having the Y' axis as a long side is disposed and a first mask 20 is disposed on one face in the Z' axis direction. According to at least one embodiment, the other side 10' of the AT-cut quartz piece 10 is fixed by a fixing part.

Figure 8B:
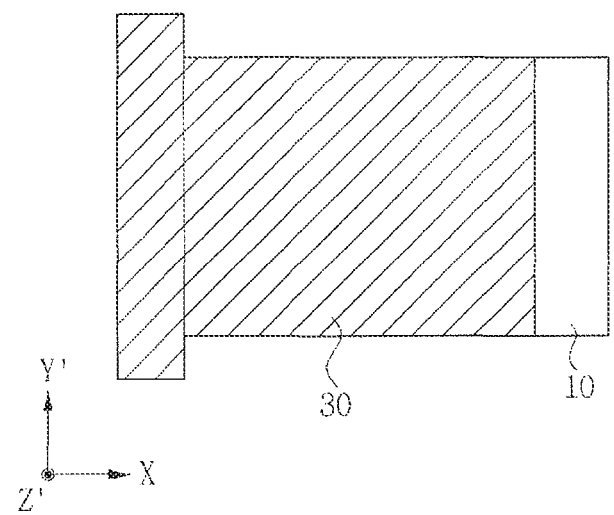

According to at least one embodiment, as shown in FIG. 8B, a second mask 30 is disposed on the other face in the Z' axis direction. In this case, the first mask 20 is disposed to be spaced apart from the second mask 30 in the Y' axis direction. This is to uniform an etched face and easily implement a chip separation as a position of the mask is shifted and the mask is etched.

Figure 8C:
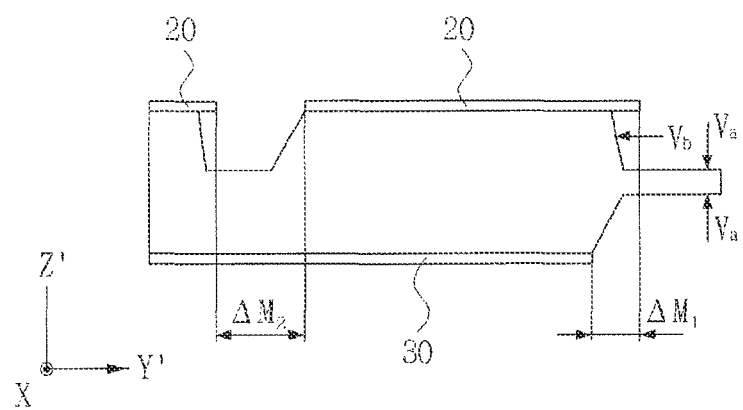
Figure 8D:
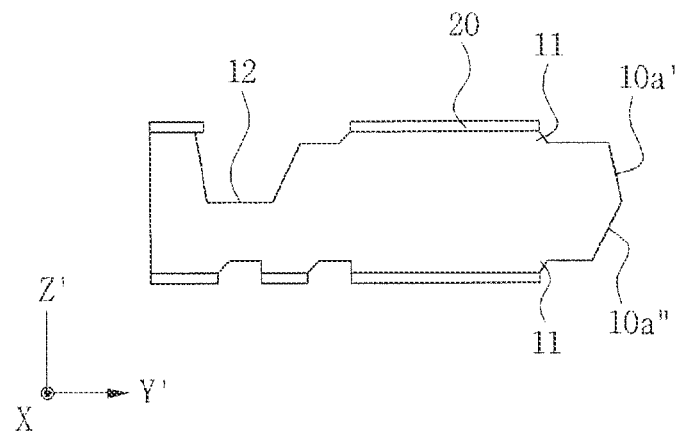

According to at least one embodiment, as shown in FIG. 8C, the AT-cut quartz piece 10 is etched, and in order to form the bevel as shown in FIG. 8D, the first mask 20 and the second mask 30 are removed and third masks 40 are formed on both surfaces of the AT-cut quartz piece 10 in the Z axis direction and are etched to thereby form protrusion parts 11.

According to at least one embodiment, the remaining part in the other side direction shown in FIG. 8C is removed by the etching for forming the protrusion parts 11, such that the first crystal face 10a' and the second crystal face 10a' axis direction and a cuttable groove part 12 is formed on the other side.

Figure 8E:
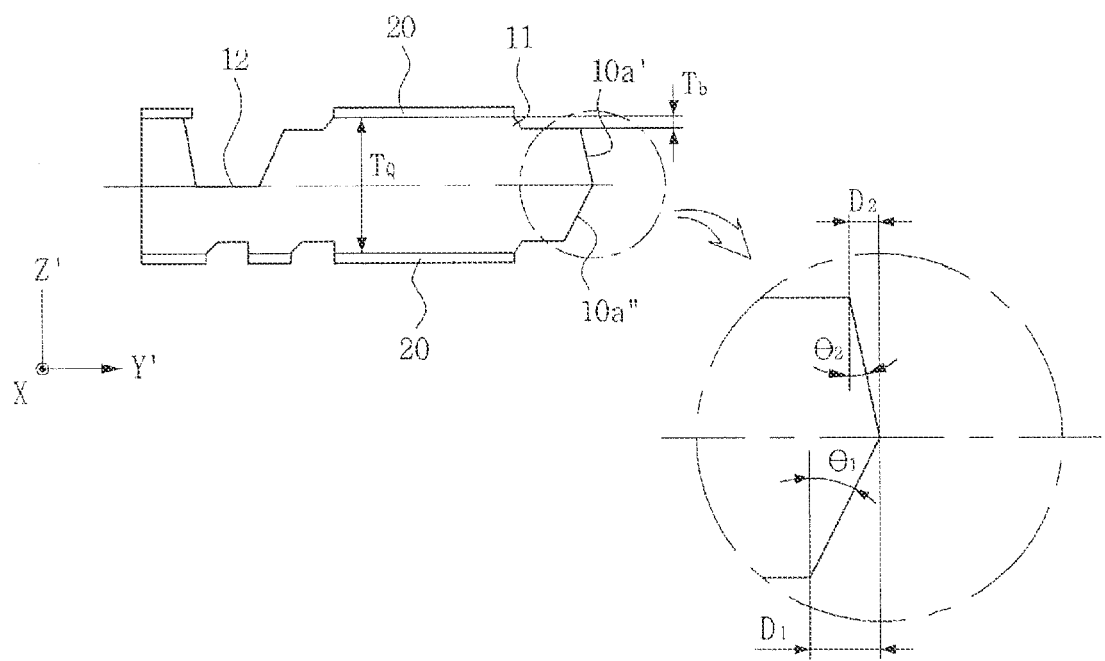

According to at least one embodiment, as shown in FIG. 8E, the electrode layers 20 are formed such that the bevel is formed on the AT-cut quartz piece.

According to at least one embodiment, $\Delta M_1$, which is a spaced distance between the first mask 20 and the second mask 30, is calculated as follows.

More specifically, in order to set the $\Delta M_1$, when it is defined that $V_a$ is an etching rate of the AT-cut quartz piece in a vertical direction (the Z' axis direction), $V_b$ is an etching rate of the AT-cut quartz piece in a horizontal direction (the Y' axis direction), $T_Q$ is a thickness of the AT-cut quartz piece in the vertical direction (the Z' axis direction), $T_b$ is a thickness of the bevel in the vertical direction (the Z' axis direction), $\theta_1$ is an angle formed by an AT-cut reference face of the quartz vibrating piece and the first etched crystal face of the quartz vibrating piece, and $\theta_2$ is an angle formed by the AT-cut reference face of the quartz vibrating piece and the second etched crystal face of the quartz vibrating piece, a side etching time of the quartz vibrating piece is $(T_Q-2T_b)/2V_a$ and an etching time of the bevel is $T_b/V_a$.

According to at least one embodiment, the $\Delta M_1$, which is the spaced distance between the first mask and the second mask, is calculated as a horizontal distance $(+D_1-D_2)$ that the first crystal face is etched at a velocity of $V_b$ at a time in which the side of the quartz vibrating piece is to be penetrated.

Thus, the spaced distance between the first mask and the second mask is as follows:

$$\Delta M_1 = \frac{V_b(T_Q - 2T_b)}{2V_a} + \tan\theta_1 \times \left(\frac{T_Q - 2T_b}{2}\right) - \tan\theta_2 \times \left(\frac{T_Q - 2T_b}{2}\right)$$

According to at least one embodiment, a margin of the $\Delta M_1$, which is the spaced distance between the first mask and the second mask, is set to about 20%.

Figure 8F:
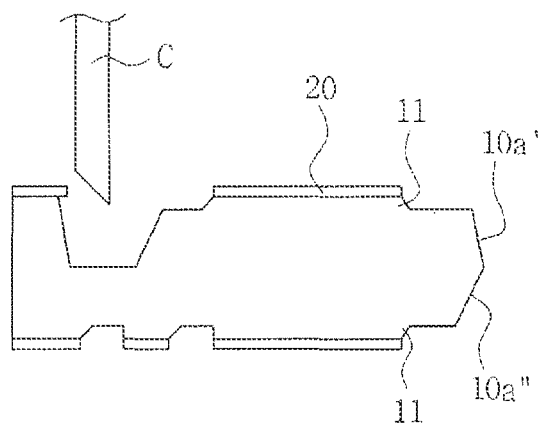

According to at least one embodiment, as shown in FIG. 8F, the groove part 12 of the other side is pressed by a cutter C to thereby separate the quartz vibrator as a single chip.

By the configuration as described above, the quartz vibrator 100 according to the first embodiment of the present invention as shown in FIGS. 1 to 4 is finished.

Figure 9A:
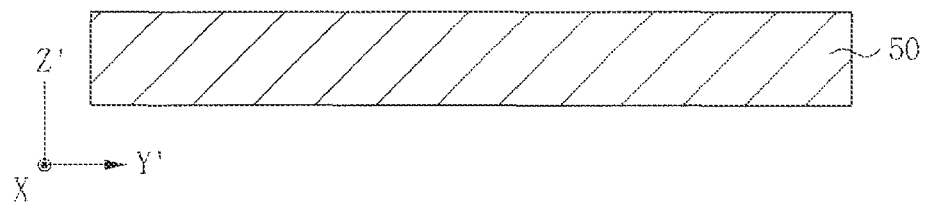
FIGS. 9A to 9R are process views schematically showing a manufacturing method of a quartz vibrator according to the second embodiment of the invention.
Figure 9B:
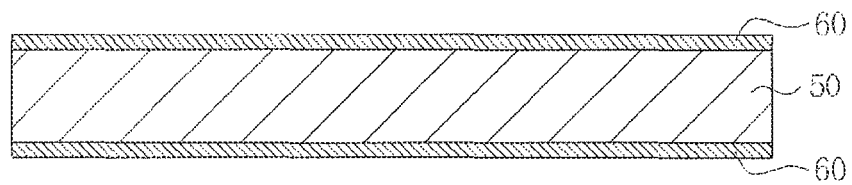
Figure 9C:
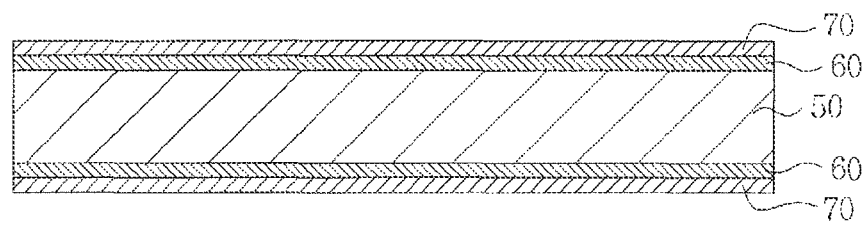
Figure 9D:
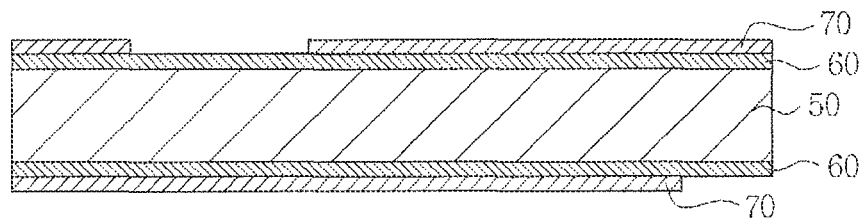
Figure 9E:
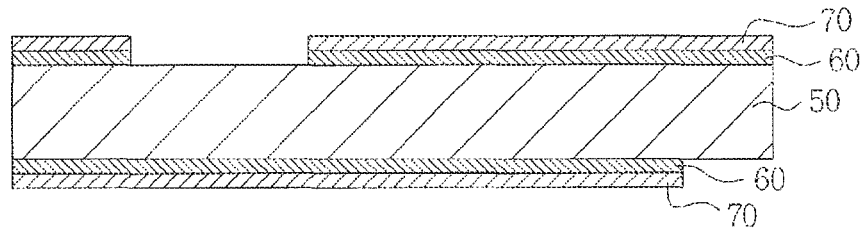
Figure 9F:
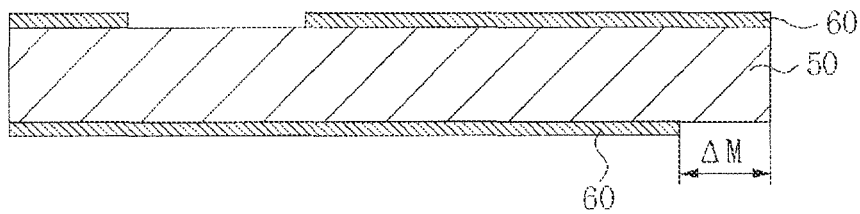
Figure 9G:
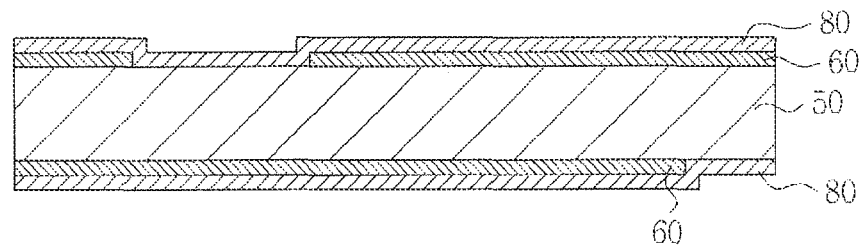
Figure 9H:
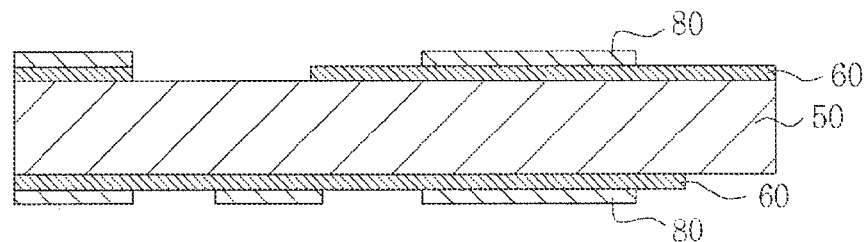
Figure 9I:
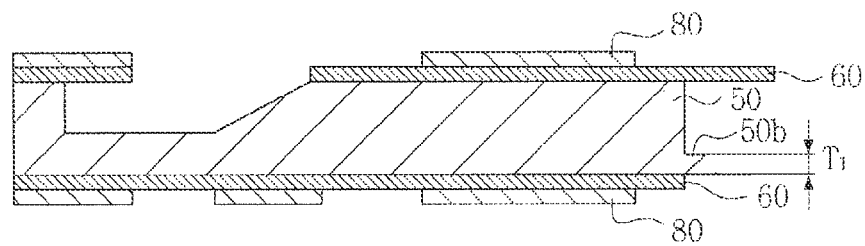
Figure 9J:
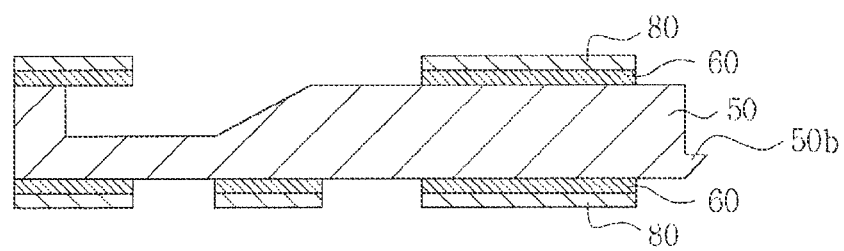
Figure 9K:
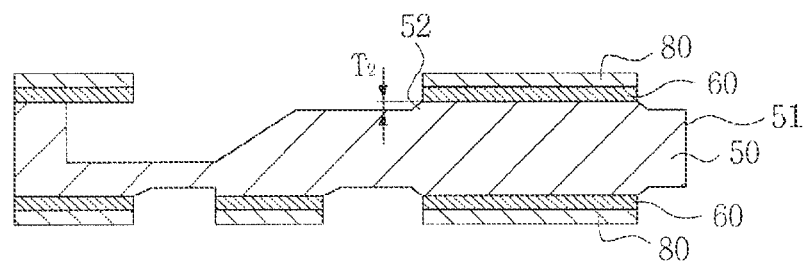
Figure 9L:
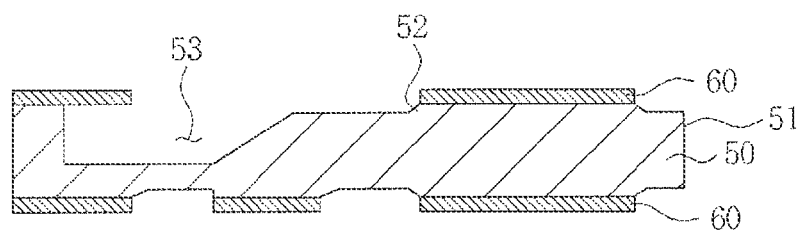
Figure 9M:
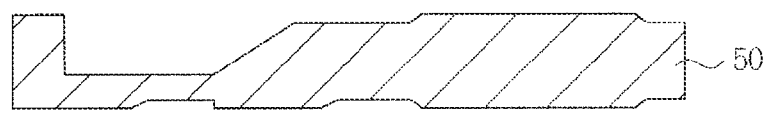
Figure 9N:
Figure 9O:
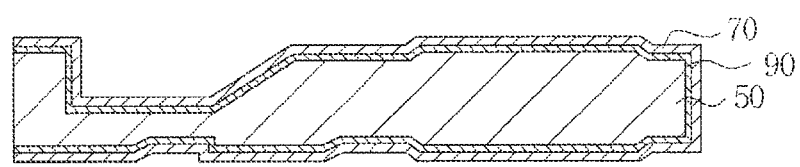
Figure 9P:
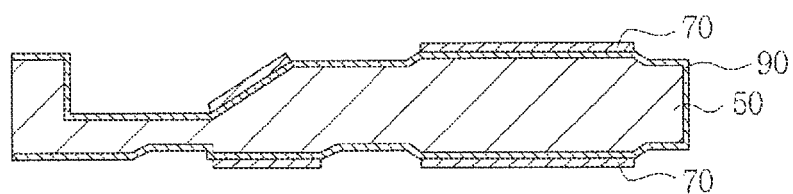
Figure 9Q:
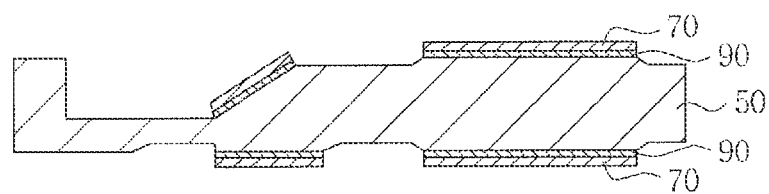
Figure 9R:
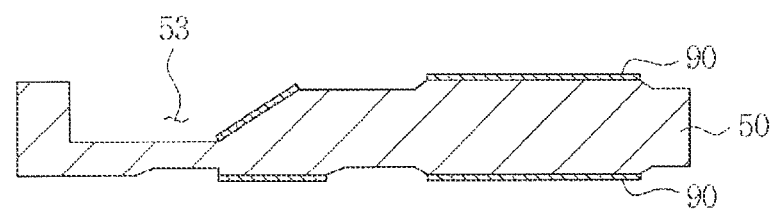

FIGS. 9A to 9R are process views schematically showing a manufacturing method of a quartz vibrator according to the second embodiment of the invention.

First, as shown in FIG. 9A, an AT-cut quartz piece 50 is prepared, and as shown in FIG. 9B, mask metal layers 60 are formed on both surfaces of the AT-cut quartz piece 50 in the Z' axis direction.

Next, as shown in FIG. 9C, photoresist layers 70 are formed on the mask metal layers 60, respectively. In addition, as shown in FIGS. 9D, 9E, and 9F, the mask metal layers 60 are formed on predetermined regions by an exposure, an etching, and a removal of the photoresist layer 70.

According to at least one embodiment, the mask metal layer 60 is formed to have a position deviation $\Delta M$ in the Y' axis direction. According to at least one embodiment, the position deviation $\Delta M$ is calculated by the same method as the method of calculating the $\Delta M_1$ as described above.

Next, as shown in FIG. 9G, photoresist layers 80 for forming the bevel are formed. According to at least one embodiment, as shown in FIG. 9H, the photoresist layers 80 are formed on predetermined regions by the exposure. In addition, as shown in FIG. 9I, the AT-cut quartz piece 50 is etched. In this case, one side in the Y' axis direction does not have a multi-face formed by the position deviation of the photoresist layer and is smoothly etched, such that only a protrusion part 50b remains.

Next, as sequentially shown in FIGS. 9J and 9K, the mask metal layers 60 are wet-etched and the AT-cut quartz piece is etched in order to form the bevel, such that a bevel protrusion part 50c for the bevel is formed. In addition, the protrusion part 50b formed on one side in the Y' axis direction is etched, such that only a first crystal face 51 remains. According to at least one embodiment, a groove part 53 for a cutting is formed in the other side.

Next, as shown in FIGS. 9L and 9M, the photoresist layers 80 are removed and the mask metal layers 60 are wet-etched.

Next, as shown in FIG. 9N, an electrode metal layer 90 is formed. According to at least one embodiment, as shown in FIG. 9O, photoresist layers 70 for etching the electrode metal layer 90 are formed on the electrode metal layer 90. According to at least one embodiment, as shown in FIGS. 9P and 9Q, the electrode metal layer 90 is formed on a bevel protrusion part 52 by the exposure and the wet-etching.

Meanwhile, a thickness $t_1$ of the protrusion part 50b is formed to be two times of a thickness $t_2$ of the bevel protrusion part 52. Accordingly, as the protrusion part is etched and removed by the etching process for forming the bevel protrusion part 50c, a manufacturing time is reduced, thereby making it possible to improve productivity.

According to at least one embodiment, as shown in FIG. 9R, the photoresist layers 70 are removed. Next, the quartz vibrator according to the second embodiment of the invention shown in FIGS. 5, 6, and 7 is finished by cutting one end of the AT-cut quartz piece.

As set forth above, according to various embodiments of the invention, the quartz vibrator capable of increasing the effect of the energy trap, allowing the low equivalent serial resistance (ESR), and having the stable natural frequency as the irregular multi-face is not formed on the side by machining the side using position deviation of the mask upon machining the side of the AT-cut quartz vibrating piece to thereby enable the correct chip design and form the stable structure, and the manufacturing method of the same may be obtained.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the present invention may suitably comprise, consist or consist essentially of the elements disclosed and may be practiced in the absence of an element not disclosed. For example, it can be recognized by those skilled in the art that certain steps can be combined into a single step.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

Ranges may be expressed herein as from about one particular value, and/or to about another particular value. When such a range is expressed, it is to be understood that another embodiment is from the one particular value and/or to the other particular value, along with all combinations within said range.

Although the present invention has been described in detail, it should be understood that various changes, substitutions, and alterations can be made hereupon without departing from the principle and scope of the invention. Accordingly, the scope of the present invention should be determined by the following claims and their appropriate legal equivalents.

What is claimed is:

1. A quartz vibrator, comprising:
   a long side in a Y' axis direction;
   a side in the Y' axis direction comprising a first crystal face and a second crystal face formed thereon; and
   an other side comprising an AT-cut quartz piece comprising a first crystal face and a second crystal face formed thereon and electrode layers formed on the AT-cut quartz piece.

2. The quartz vibrator of claim 1, wherein the first crystal face and the second crystal face formed on one side of the AT-cut quartz piece and the first crystal face formed on the other side thereof are formed of an inclined face.

3. The quartz vibrator of claim 1, wherein the second crystal face formed on the other side of the AT-cut quartz piece is formed in a direction perpendicular to the Y' axis direction.

4. The quartz vibrator of claim 1, wherein the AT-cut quartz piece comprises a short side of an X axis and a thickness in a Z' axis direction.

5. The quartz vibrator of claim 4, wherein the AT-cut quartz piece comprises one side in the X axis direction comprising the first crystal face and the second crystal face formed thereon and the other side comprising the first crystal face and the second crystal face formed thereon.

6. The quartz vibrator of claim 5, wherein the first crystal face and the second crystal face formed on one side of the AT-cut quartz piece and the first crystal face and the second crystal face formed on the other side thereof are formed of an inclined face.

7. The quartz vibrator of claim 1, wherein the AT-cut quartz piece comprises protrusion parts formed on both surfaces in a Z' axis direction, and the electrode layers are each formed on the protrusion parts.

8. The quartz vibrator of claim 1, wherein the AT-cut quartz piece is vibrated in an X axis direction.

9. A quartz vibrator, comprising:
   a long side in a Y' axis direction;
   one side in the Y' axis direction comprising a first crystal face formed thereon; and
   an other side including an AT-cut quartz piece comprising a first crystal face and a second crystal face formed thereon and electrode layers formed on the AT-cut quartz piece.

10. The quartz vibrator of claim 9, wherein the first crystal face formed on the other side of the AT-cut quartz piece is formed of an inclined face.

11. The quartz vibrator of claim 9, wherein the second crystal face formed on the other side of the AT-cut quartz piece is formed in a direction perpendicular to the Y' axis direction.

12. The quartz vibrator of claim 9, wherein the AT-cut quartz piece comprises a short side of an X axis and a thickness in a Z' axis direction.

13. The quartz vibrator of claim 12, wherein the AT-cut quartz piece comprises one side in the X axis direction comprising the first crystal face and the second crystal face formed thereon and the other side comprising the first crystal face and the second crystal face formed thereon.

14. The quartz vibrator of claim 13, wherein the first crystal face and the second crystal face formed on one side of the AT-cut quartz piece and the first crystal face and the second crystal face formed on the other side thereof are formed of an inclined face.

15. The quartz vibrator of claim 9, wherein the AT-cut quartz piece comprises protrusion parts formed on both surfaces in a Z' axis direction, and the electrode layers are each formed on the protrusion parts.

* * * * *